United States Patent [19]

Ichiguchi

[11] Patent Number: 5,222,042
[45] Date of Patent: Jun. 22, 1993

[54] DYNAMIC SEMICONDUCTOR MEMORY DEVICE FOR RAISING VOLTAGE LEVEL OF A WORD LINE

[75] Inventor: Tetsuchiro Ichiguchi, Hyogo, Japan

[73] Assignee: Mitsubishi Denki Kabushiki Kaisha, Tokyo, Japan

[21] Appl. No.: 754,807

[22] Filed: Sep. 4, 1991

[30] Foreign Application Priority Data

Sep. 19, 1990 [JP] Japan ................................. 2-251307

[51] Int. Cl.⁵ ............................................. G11C 11/40
[52] U.S. Cl. ............................... 365/189.01; 365/203; 365/230.01
[58] Field of Search ..................... 365/189.01, 230.01, 365/203, 154, 226

[56] References Cited

U.S. PATENT DOCUMENTS 4,649,523  3/1987  Holder, Jr. et al. .
4,933,907  6/1990  Kumanoya et al. .
4,953,127  8/1990  Nagahashi et al. ................ 365/226

FOREIGN PATENT DOCUMENTS

3329096C2  3/1984  Fed. Rep. of Germany .

Primary Examiner—Terrell W. Fears
Attorney, Agent, or Firm—Lowe, Price, LeBlanc & Becker

[57] ABSTRACT

A dynamic semiconductor memory device capable of boosting a word line of a memory cell array higher than supply voltage, and methods of boosting the level of the word line are disclosed. The dynamic RAM of the present invention includes a RAS (Row Address Strobe) buffer, an address buffer, a write buffer, a word line driving signal generating circuit, a first word line boost circuit and a second word line boost circuit. The word line driving signal generating circuit boosts the word line to the supply voltage in response to a row address strobe signal from the RAS buffer. The first word line boost circuit boosts the word line to be higher than the supply voltage. The second word line boost circuit again boosts the word line in response to a write enable signal from the write buffer. In this manner, unsuccessful writing due to leakage of capacitance can be suppressed.

10 Claims, 6 Drawing Sheets

DYNAMIC SEMICONDUCTOR MEMORY DEVICE FOR RAISING VOLTAGE LEVEL OF A WORD LINE

BACKGROUND OF THE INVENTION

1. Field of the Invention

The present invention relates to dynamic memory devices and, more specifically, to a dynamic semiconductor memory device improved to raise voltage level of word lines.

2. Description of the Background Art

Recently, in order to meet the demand of microelectronics implementation of various devices in industry and in civil equipments, VLSIs (Very Large Scale Integrated circuits) having larger scale than LSIs (Large Scale Integrated circuits) have been developed and come to be commercially used.

FIG. 6 is a block diagram of a dynamic RAM (Random Access Memory) formed of such a LSI or VLSI. Referring to FIG. 6, the dynamic RAM includes a memory array 1, a word line driving signal generating circuit 2 for generating a signal $R_X$ for driving word lines WL included in the memory array 1, and a word line boost circuit 3 for boosting the word line driving signal $R_X$. The word line driving signal generating circuit 2 is connected to receive a $\overline{RAS}$ (Row Address Strobe) signal through a $\overline{RAS}$ buffer 4. A row decoder 1a, a sense amplifier 1b, a column decoder 1c and an I/O gate 1d are connected to the memory array 1. The dynamic RAM is accessed by row address signals·column address signals output from an address buffer 5 to the memory array 1.

The operation will be described in the following.

Generally, the dynamic RAM receives time sequentially the row and column address signals through terminals A0 to A9. First, the respective address signals are input at an edge timing at which the $\overline{RAS}$ signal and a $\overline{CAS}$ (Column Address Strobe) signal from the $\overline{CAS}$ buffer 6 fall, respectively. Then a word line is selected by the row address signal, and by a word line driving signal $R_{XB}$ which has been boosted, the word line is activated. A bit line is selected by the column address signal. Consequently, in reading operation, a signal stored in the memory cell is applied to the bit line. The signal applied to the bit line is output through the I/O gate 1d→output buffer 7→data output terminal Dout. In writing, in response to a write enable signal $\overline{WE}$ from a write buffer 8, input data is applied to the memory cell through the data input terminal Din→input buffer 9→I/O gate 1d.

FIG. 7 is a block diagram showing the memory cell, the row decoder and the boost circuit. Referring to FIG. 7, the memory cell MC includes a capacitor $C_S$ and a switching transistor $Q_M$ connected to the word line WL and to the bit line BL. By applying a voltage of high level "1" or low level "0" to the capacitor $C_S$, a signal is stored. When the word line WL is activated, the transistor $Q_M$ is turned on. When the transistor $Q_M$ is turned on, the charges stored in the capacitor $C_S$ are applied to the bit line BL which has been at a floating state. The stray capacitance of the bit line BL is about ten times the capacitance of the capacitor $C_S$. Therefore, a potential change as small as about several hundred milli-volts appears on the bit line BL. The potential change is amplified by a sense amplifier 1b and is applied to the I/O gate 1d for reading/writing.

By the above described series of operations, a signal from a designated memory cell MC of the plurality of memory cells MCs of the memory array 1 is applied through the I/O gate 1d to the output buffer 7. In writing, in response to a write enable signal $\overline{WE}$, the write buffer 8 drives an input buffer 9, and data applied through the input buffer 9 is written through the I/O gate to the memory cell MC.

The word line boost circuit will be described in the following.

When the word line WL is changed to the high level, the transistor $Q_M$ is turned on. If this high level is the supply voltage level $V_{cc}$, the high storage level is reduced by the threshold voltage $V_{TH}$ of the transistor $Q_M$. The ratio of this loss is normally about 20%, which is not so high as to immediately cause malfunction. However, if the supply voltage level becomes lower, the loss becomes greater comparatively, reducing operation margin. The word line boost circuit is used to solve this problem. This circuit serves to raise the voltage level of the word line to be higher than the sum of the supply voltage level $V_{cc}$ and the threshold value $V_{TH}$ of the transistor $Q_M$. The word line boost circuit 3 of FIG. 7 attains this object. The word line boost circuit 3 includes a charge line 31 for charging the word line WL, a delay circuit 32 connected to receive the word line driving circuit $R_X$, and a boosting capacitor 33 connected between the charge line 31 and the output of the delay circuit 32.

FIG. 8 is a timing diagram illustrating the operation of the word line boost circuit 3 shown in FIG. 7.

Referring to FIGS. 7 and 8, the operation of the word line boost circuit 3 will be described. At time T0, the word line driving signal $R_X$ changes to the high level. The output signal $R_{XB}$ is delayed by the delay circuit 32 and changes to the high level at time T1. Consequently, the voltage level of the output signal $R_{XB}$ is raised to a level $V_{cc}+V\alpha$ due to the capacitance coupling of the capacitor 33, which level is higher than the supply voltage level $V_{cc}$. By appropriately setting the capacitance value of the capacitor 33, $V\alpha$ is made higher than the threshold voltage $V_{TH}$ of the transistor $Q_M$. In this manner, the word line driving signal $R_X$ is boosted, providing the boosted word line driving signal $R_{XB}$. The high level signal $R_{XB}$ is output from an output which is in a floating state, separated from the power supply. The boosted word line driving signal $R_{XB}$ is applied to the memory array 1 though the row decoder 1a, and activates the word line WL selected by the row decoder 1a.

Returning to FIG. 7, the row decoder will be described. Referring to FIG. 7, the row decoder 1a includes a plurality of unit row decoders RD each for activating one of a plurality of rows. For the simplicity of description, a row decoder for one row is shown. The unit row decoder RD includes an NAND gate 11 connected to receive row decoder address signals RA1 to RA9, an inverter 12 connected to the output thereof, and three N channel transistors $Q_{AK}$, $Q_{BK}$ and $Q_{CK}$.

In operation, when this unit row decoder RD is selected, for example, the row address signals RA0 to RA9 are set to high level, and the NAND gate 11 outputs a low level signal. This signal is inverted by the inverter 12 and applied to the gate of the transistor $Q_{BK}$ and to the gate of the transistor $Q_{CK}$. Consequently, the transistor $Q_{BK}$ is turned on, and the boosted word line driving signal $R_{XB}$ is applied to the word line $WL_K$ through the transistor $Q_{BK}$.

However, in the conventional word line boost circuit 3, when there is a leak in the capacitor 33, the level of the word line driving signal $R_{XB}$ gradually lowers, as shown in FIG. 9. Especially when the RAS signal has a long period (longer than several ten μsec), the level of the boosted word line driving signal $R_{XB}$ becomes too low to activate the word line WL. Therefore, when the write enable signal $\overline{WE}$ falls to write new data to the memory cell MC near the end of the period of the RAS signal, the channel of the transistor $Q_M$ is not perfectly formed, since the level of the word becomes very low. Therefore, data can not be written to the memory cell. In other words, the conventional boost circuit has small write margin.

SUMMARY OF THE INVENTION

Therefore, an object of the present invention is to provide a dynamic semiconductor memory device enabling larger write margin and to provide a method of boosting level of a word line.

Another object of the present invention is, in a dynamic semiconductor memory device, not to lower level of the word line in writing.

A further object of the present invention is, in a dynamic semiconductor memory device, to surely effect writing, even if a row address strove signal has a long period.

Briefly, the dynamic semiconductor memory device in accordance with the present invention includes memory cells arranged at crossings of a plurality of word lines and a plurality of bit lines, and a memory array including at least one of said memory cells. The dynamic semiconductor memory device further includes a row address strobe buffer, an address buffer, a write buffer, a word line driving signal generating circuit, a first word line boost circuit, a second word line boost circuit, and a row decoder. The row address strobe buffer receives an external row address strobe signal for controlling state of storage of the dynamic RAM. The write buffer receives an external write enable signal. The address buffer receives an external address signal for addressing the dynamic RAM. The word line driving signal generating circuit sets the word line to the supply voltage, in response to the row address strove signal input through the row address strobe buffer. The first word line boost circuit raises the level of the word line higher than the supply voltage. The second word line boost circuit raises again the level of the word line in response to the write enable signal. The row decoder is connected to the memory cell array, decodes the address signal from the address buffer, and supplies driving voltage which has been boosted by the second word line boost circuit to the word line corresponding to the address signal.

In operation, in response to a write signal applied from the write control signal input means, the word line boost circuit raises the level of the word line to be higher than the supply voltage in writing, and therefore, even if the level of the word line lowers due to a leak of the capacitor, writing can be effected.

Consequently, even if the level of the word line lowers during writing, the level of the word line can be raised again, and therefore the write margin can be enlarged.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
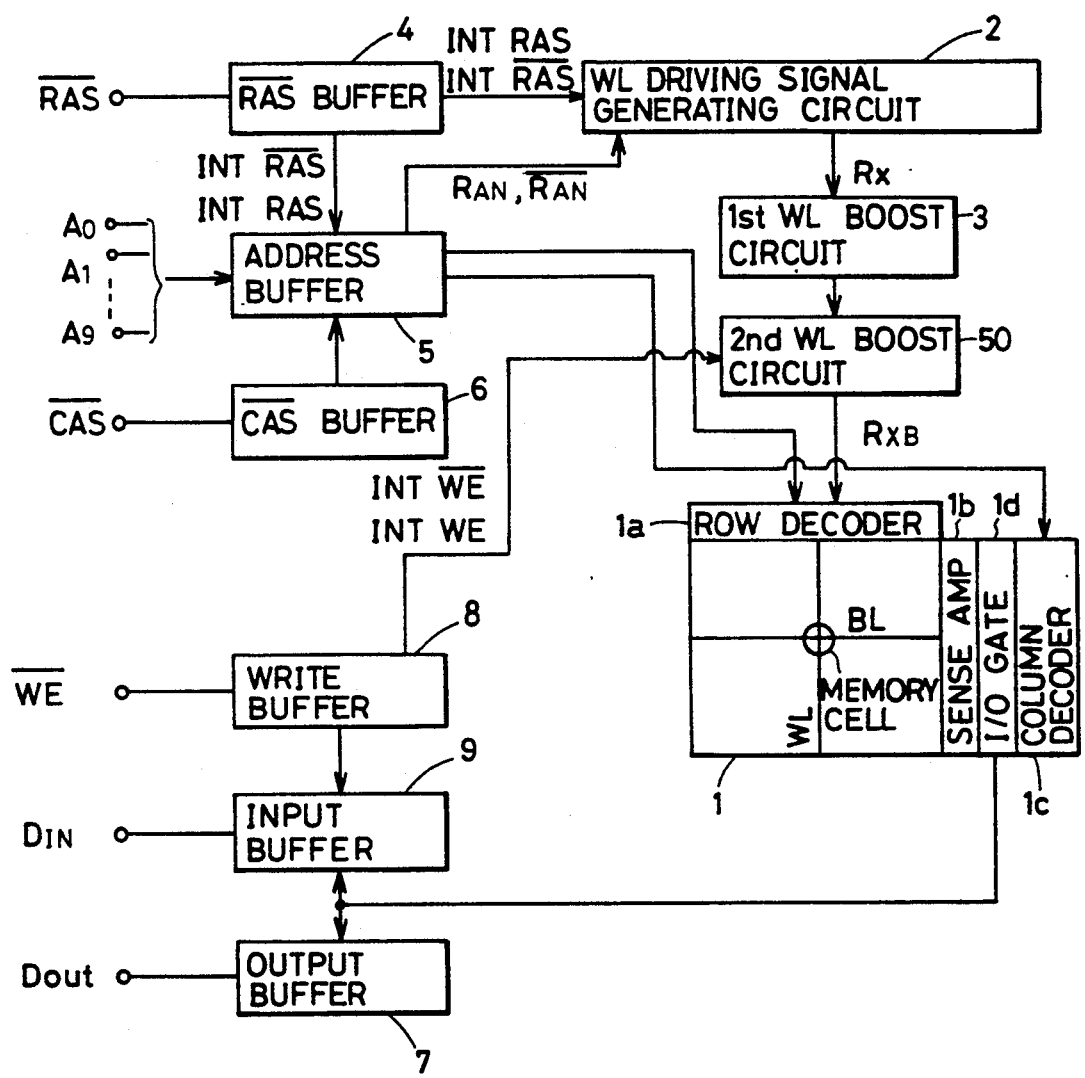
FIG. 1 is a block diagram showing one embodiment of the present invention.
Figure 6:
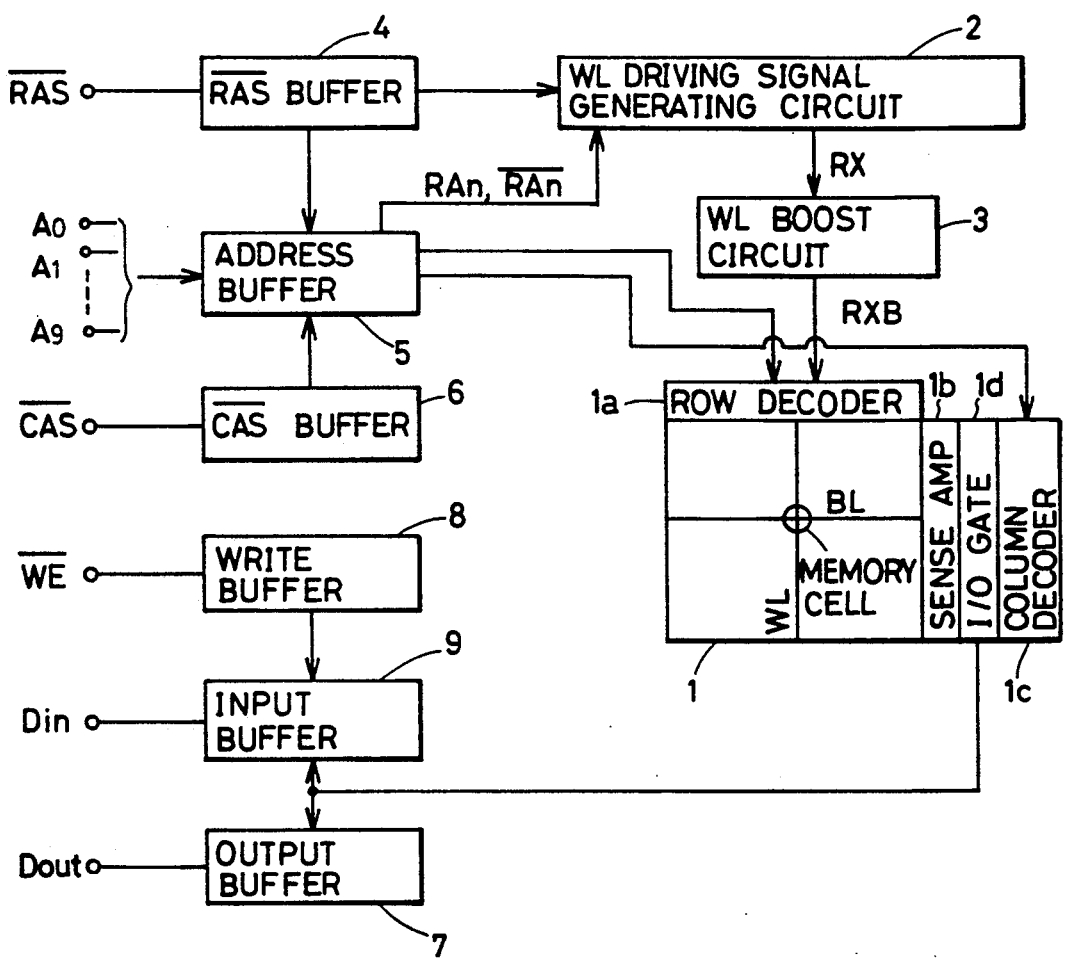
FIG. 6 is a block diagram of a conventional dynamic RAM.

FIG. 1 is a block diagram showing one embodiment of the present invention. Referring to the figure, different from the dynamic RAM of FIG. 6, a second word line boost circuit 50 is connected between the word line boost circuit 3 and the memory array 1, and internal write enable signals $\overline{WE}$ and WE are applied to the word line boost circuit 50 from the write buffer 8. The same or corresponding portions are denoted by the same reference characters as FIG. 6. The second word line boost circuit 50 raises again the word line boost signal $R_{XB}$ from the first word line boost circuit 3 again in response to the internal $\overline{WE}$ and WE signals from the write buffer 8, and applies this signal to the memory array 1.

Figure 2:
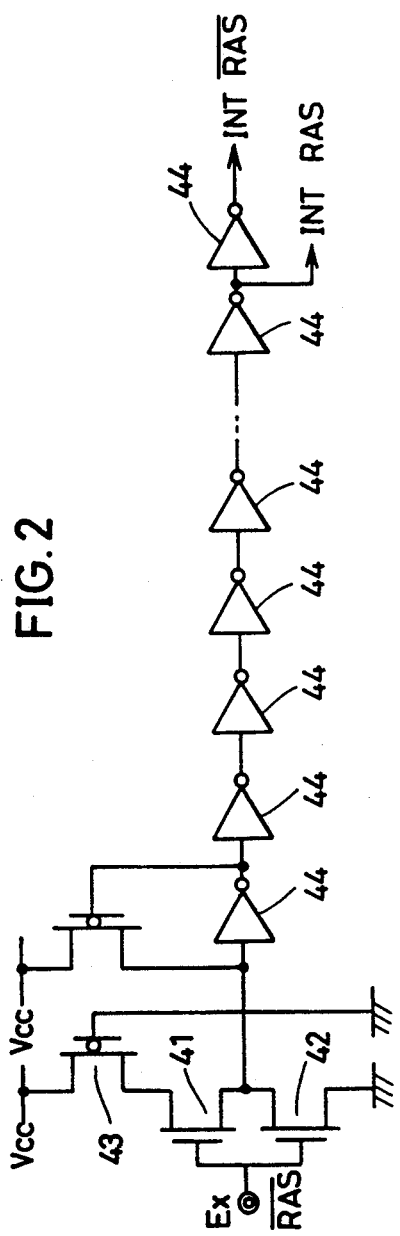
FIG. 2 is a schematic diagram showing the details of the $\overline{RAS}$ buffer 4 of FIG. 1.

FIG. 2 is a schematic diagram showing the details of the $\overline{RAS}$ buffer shown in FIG. 1. Referring to this figure, the $\overline{RAS}$ buffer 4 includes an N channel transistor 41 receiving an external $\overline{RAS}$ signal at its gate, an N channel transistor 42, a P channel transistor 43 supplying supply voltage to the drain of the transistor 41, and a plurality of inverters 44. In operation, in response to the external $\overline{RAS}$ signal, an internal $\overline{RAS}$ signal is output from the inverter 44 of the last stage, and an internal RAS signal is output from the second last inverter. The internal $\overline{RAS}$ and RAS signals output from the $\overline{RAS}$ buffer 4 are applied to the word line driving signal generating circuit 2.

Figure 3:
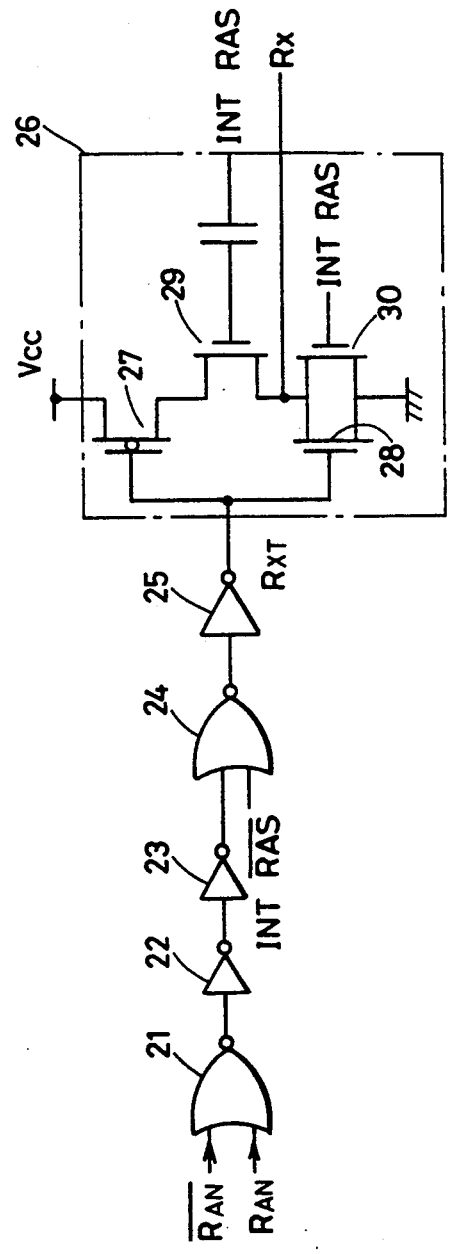
FIG. 3 shows details of the word line driving signal generating circuit.

FIG. 3 shows details of the word line driving signal generating circuit 2. The word line driving signal generating circuit 2 includes an NOR gate 21 receiving $R_{AN}$ and $R_{AN}$ for selecting a memory array from the address buffer 5; an NOR gate 24 receiving an output from the NOR gate 21 input through the inverters 20 and 23 and the external $\overline{RAS}$ signal; an inverter 25 inverting the output from the NOR gate 24 for generating a trigger signal $R_{XT}$ for generating a driving voltage; and a switching circuit 26 for generating the driving voltage $R_X$ based on the trigger signal $R_{XT}$ and on the internal $\overline{RAS}$ and RAS signals. The switching circuit 26 further includes a P channel transistor 27 and three N channel transistors 28, 29 and 30. In operation, the word line driving signal generating circuit 2 generates a trigger signal $R_{XT}$ for driving a desired word line of the memory array, in response to the signals $R_{AN}$ and $R_{AN}$ from the address buffer 5 and to the internal $\overline{RAS}$ signal. In response to the low level of the trigger signal $R_{XT}$, the P channel transistor 27 is turned on. In response to a high level of the internal RAS signal, the N channel transistor 29 is turned on. Consequently, the output from the switching circuit 26 is raised to the supply voltage. Until the low level of the trigger signal $R_{XT}$ is input, the internal $\overline{RAS}$ signal is kept at the high level, and in response to this high level signal, the N channel transistor 30 is turned on. Consequently, the output from the switching circuit 26 is set to the low level. Namely, the N channel transistor 30 is in the standby state.

Figure 4:
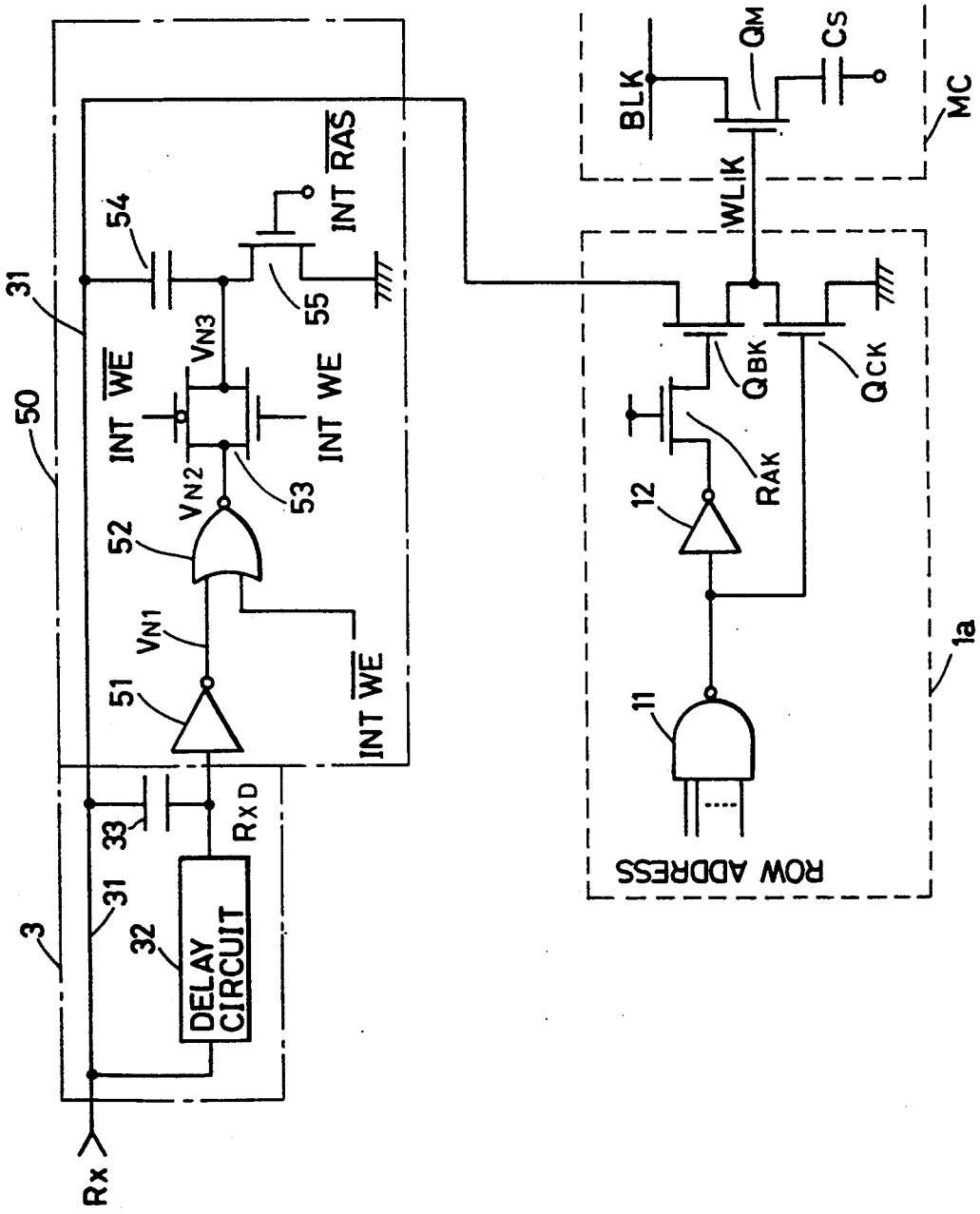
FIG. 4 is a schematic diagram showing details of the first word line boost circuit, the second word line boost circuit and the memory array.
Figure 5:
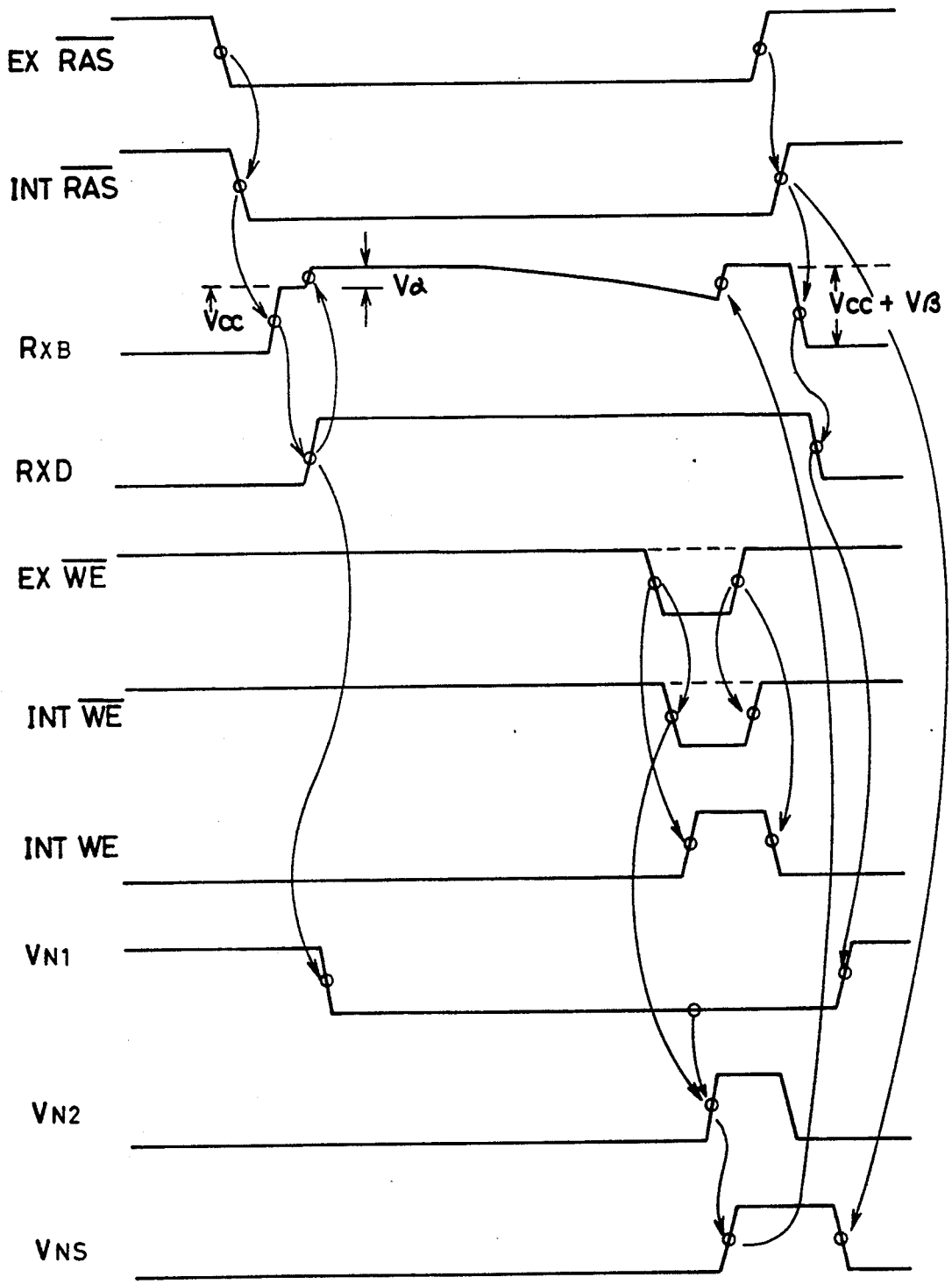
FIG. 5 is a diagram of waveforms for describing the word line boosting operation of the dynamic RAM shown in FIGS. 1 to 4.
Figure 7:
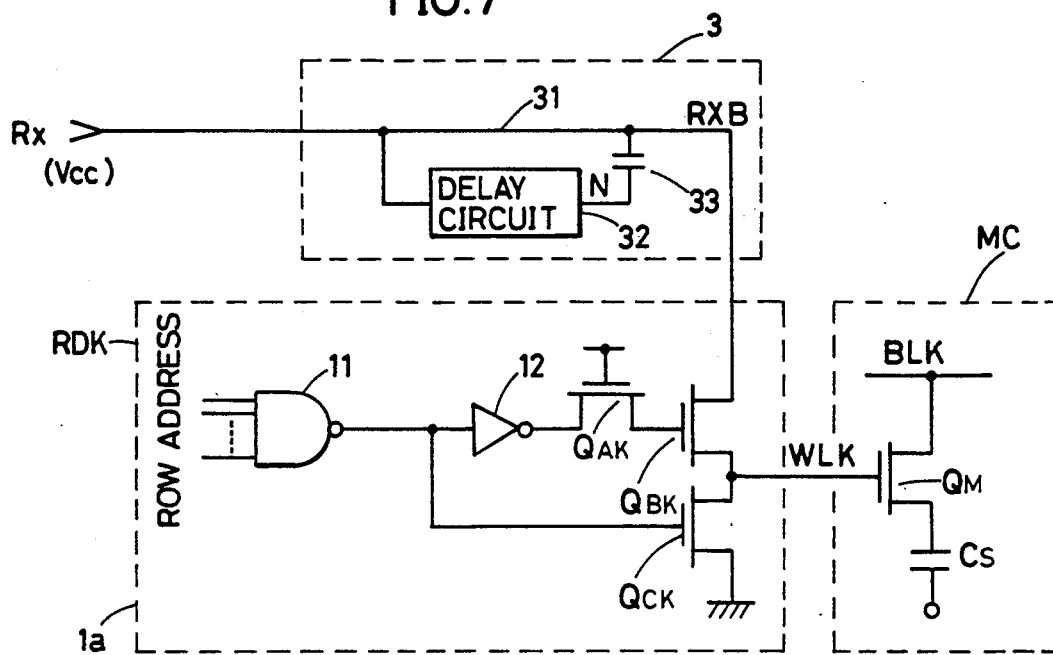
FIG. 7 is a schematic diagram showing the details of the conventional word line boost circuit and the memory array.
Figure 8:
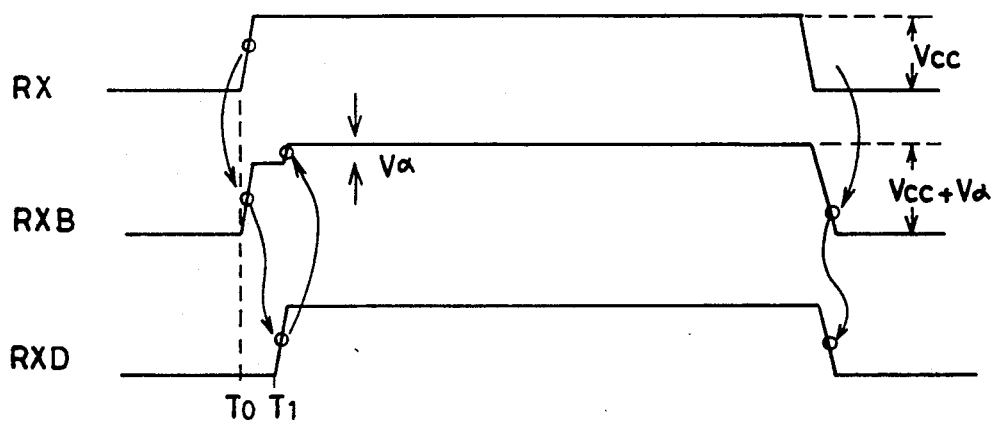
FIG. 8 is a diagram of waveforms for illustrating the operation of the word line boost circuit of FIG. 7.
Figure 9:
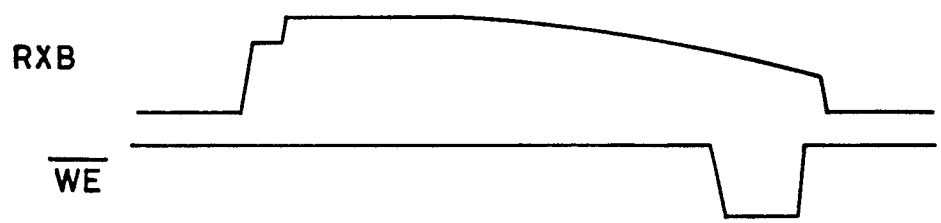
FIG. 9 is a diagram of signal waveforms of various portions for describing the problems of the prior art.

FIG. 4 shows connections between the first word line boost circuit 3, the second word line boost circuit 50 and the memory array 1 of FIG. 1. Referring to the figure, different from FIG. 7, the second word line boost circuit 50 is connected. The second word line boost circuit 50 includes an inverter 51 connected to an output of the delay circuit 32; an NOR gate 52 receiving the output from the inverter 51 and the internal $\overline{WE}$ signal; a transmission gate 53 connected to an output of the NOR gate 52; a capacitor 54 connected between the output of the transmission gate 53 and the charge line 31; and an N channel transistor 55 connected between the capacitor 54 and the ground terminal. The transmission gate 53 connects the output of the NOR gate 52 to the capacitor 54 in response to the internal $\overline{WE}$ and WE signals. FIG. 5 shows signal waveforms of the circuits in the dynamic RAM shown in FIGS. 1 to 4. Referring to the figure, the word line boosting operation of the dynamic RAM of the present embodiment will be described. The reference characters $V_N1$, $V_N2$ and $V_N3$ respectively represent the waveform of the output signal from the inverter 51, and the waveforms of the input/output signals of the transmission gate 53. When the external $\overline{RAS}$ signal is input, the $\overline{RAS}$ buffer 4 latches this signal, and provides internal $\overline{RAS}$ and RAS signals from the latched signal through the plurality of inverters 44. The internal $\overline{RAS}$ and RAS signals are applied to the word line driving signal generating circuit 2. In response to the RAS and $\overline{RAS}$ signals, the word line driving signal generating circuit 2 raises the charge line 31 to the supply voltage $V_{cc}$. The charge line 31 is further raised to $V_{cc}+V\alpha$ by the first word line boost circuit 3. The above operation is approximately the same as in the prior art.

Thereafter, in response to the external write enable signal $\overline{WE}$, the write buffer 8 generates internal write enable signals $\overline{WE}$ and WE. The NOR gate 52 generates, based on the signals $\overline{WE}$ and WE and on the signal $V_N1$ from the inverter 51, a high level signal $V_N2$ only when the $\overline{RAS}$ signal is at the low level and the write enable signal $\overline{WE}$ is at the low level. The signal $V_N2$ is transmitted through the transmission gate 53 to the capacitor 54. Consequently, the capacitor 54 is charged, and the charge voltage $V\beta$ is applied to the charge line 31. Consequently, the word line driving signal $R_{XB}$ is raised to $V_{cc}+V\beta$. In this manner, the boosted word line driving signal $R_{XB}$ is transmitted through the N channel transistor $Q_{BK}$ of the row decoder 1a to the word line $WL_K$.

Thus, the level of the desired word line can be raised again during writing operation.

When the external $\overline{RAS}$ signal is inverted to the high level, the high level internal $\overline{RAS}$ signal is applied to the gate of the N channel transistor 55 of the second word line boost circuit 50. The N channel transistor 55 turns on in response to the high level internal $\overline{RAS}$ signal, and the charges in the capacitor 54 flow to the ground. Consequently, the word line driving signal $R_{XB}$ attains to the low level.

Although a plurality of memory arrays are provided in this example, the number of the memory array may be one. When the number of the memory array is one, the NOR gate and the inverter of the word line driving signal generating circuit 2 can be omitted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device including at least one memory cell array including memory cells arranged at cross sections of a plurality of word lines and a plurality of bit lines, comprising:
   state signal receiving means for receiving an external control signal for controlling storage state of said memory device;
   address receiving means for receiving an external address signal for addressing said memory device;
   write control signal receiving means for receiving an external write control signal for controlling writing to said memory device;
   word line driving signal generating means responsive to the control signal from said state signal receiving means for generating a driving signal for driving a word line;
   first boosting means for boosting said driving signal to be higher than supply voltage;
   second boosting means responsive to said write control signal for boosting again said driving signal; and
   a decoder connected to said memory cell array for decoding the address signal from said address receiving means for supplying the driving signal boosted by said second boosting means to the word line corresponding to the address signal in writing.

2. A dynamic semiconductor memory device according to claim 1, wherein
   said state signal receiving means includes means responsive to an external control signal for generating a row address strobe signal for controlling said address receiving means, said first boosting means and said second boosting means.

3. A dynamic semiconductor memory device according to claim 1, wherein
   said address signal includes a signal for selecting a desired memory cell array out of said at least one memory cell array.

4. A dynamic semiconductor memory device according to claim 3, wherein
   said word line driving signal generating means includes selecting means for selecting a desired memory cell array out of said at least one memory cell array based on said address signal and said state control signal, a word line driving line connected to the memory cell array selected by said selecting means, and charging means for charging said word line driving line to a potential of the driving signal.

5. A dynamic semiconductor memory device according to claim 1, wherein
said first boosting means includes delay means for providing a delay of a prescribed time period to the driving signal generated by said word line driving signal generating means, and first capacitor means charged by said driving signal and discharged in response to the driving signal delayed by said delay means.

6. A dynamic semiconductor memory device according to claim 1, wherein
said delay means includes a plurality of inverters connected in series.

7. A dynamic semiconductor memory device according to claim 6, wherein
said second boosting means includes second capacitor means having one end connected to said word line driving line, and write signal supplying means for supplying a write signal to the other end of said second capacitor means.

8. A dynamic semiconductor memory device according to claim 7, wherein
said second boosting means includes switching means connected between the other end of said second capacitor means and the ground for switching in response to the state signal from said state signal receiving means.

9. A dynamic semiconductor memory device according to claim 7, wherein
said write signal supply means includes an inverter connected to the delay means of said first boosting means, logic gate means receiving an output signal from said inverter and said write signal, and transmitting means connected between an output of the logic gate means and the other end of the second capacitor means, responsive to said write signal, for transmitting the output from the logic gate means to said second capacitor means.

10. A method of boosting a word line of a dynamic semiconductor memory device including at least one memory cell array including memory cells arranged at crossings of a plurality of word lines and a plurality of bit lines, comprising the steps of:
receiving an external control signal for controlling storage state of said memory device;
receiving an external address signal for addressing said memory device;
receiving an external write control signal for controlling writing to said memory device;
generating a driving signal for driving the word line, in response to the control signal from said state signal receiving means;
boosting said driving signal to be higher than supply voltage;
boosting again said driving signal in response to said write control signal; and
decoding the address signal from said address receiving means and supplying the driving signal which has been boosted again to the word line corresponding to the address signal in writing.

* * * * *